(12) United States Patent
Nakamura et al.

(10) Patent No.: US 7,745,017 B2
(45) Date of Patent: Jun. 29, 2010

(54) ORGANIC ELECTROLUMINESCENT DEVICE AND METHOD FOR PRODUCING THE SAME

(75) Inventors: Tetsuo Nakamura, Kanagawa (JP); Tatsuya Igarashi, Kanagawa (JP); Takeshi Murakami, Kanagawa (JP); Masayuki Mishima, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 729 days.

(21) Appl. No.: 11/166,158

(22) Filed: Jun. 27, 2005

(65) Prior Publication Data
US 2005/0287396 A1 Dec. 29, 2005

(30) Foreign Application Priority Data
Jun. 28, 2004 (JP) .............................. 2004-189857

(51) Int. Cl.
*H01L 51/54* (2006.01)
*C09K 11/06* (2006.01)

(52) U.S. Cl. ..................... 428/690; 428/917; 313/504; 313/506; 257/40; 257/E51.044; 546/4; 546/10; 427/66

(58) Field of Classification Search ............... 546/4, 546/10; 428/690, 917; 313/504, 506; 257/40, 257/E51.044
See application file for complete search history.

(56) References Cited

U.S. PATENT DOCUMENTS

| 2001/0019782 A1 | 9/2001 | Igarashi et al. |
| 2002/0024293 A1* | 2/2002 | Igarashi et al. ............... 313/483 |
| 2002/0064681 A1* | 5/2002 | Takiguchi et al. ........... 428/690 |
| 2003/0059646 A1* | 3/2003 | Kamatani et al. ........... 428/690 |

FOREIGN PATENT DOCUMENTS

| JP | 2002-324679 A | 11/2002 |
| JP | 2004-31004 A | 1/2004 |
| WO | WO0244189 A1 * | 6/2002 |

* cited by examiner

*Primary Examiner*—D. Lawrence Tarazano
*Assistant Examiner*—Michael Wilson
(74) *Attorney, Agent, or Firm*—Birch, Stewart, Kolasch & Birch, LLP

(57) ABSTRACT

An organic electroluminescent device and a method for producing the same, the organic electroluminescent device including a luminescent layer produced by a vapor-deposition method disposed between a pair of electrodes, the luminescent layer containing at least one host material and at least one metal complex including a partial structure represented by formula (I):

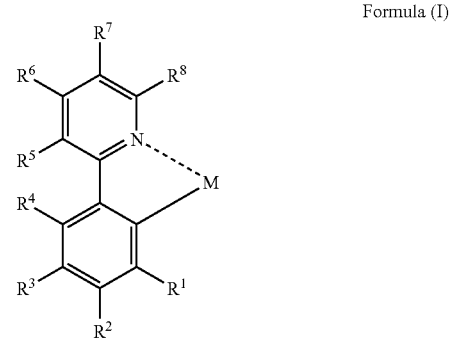

Formula (I)

wherein M represents a metal atom, $R^1$, $R^2$ and $R^4$ to $R^8$ each independently represent a hydrogen atom or a substituent, and $R^3$ represents a group represented by formula (II), an alkoxy group or an aryloxy group:

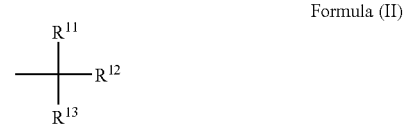

Formula (II)

wherein $R^{11}$ to $R^{13}$ each independently represent a hydrogen atom or a substituent, provided that at least two of them each independently represent an alkyl group or an aryl group.

8 Claims, No Drawings

ORGANIC ELECTROLUMINESCENT DEVICE AND METHOD FOR PRODUCING THE SAME

CROSS-REFERENCE TO RELATED APPLICATION

This application claims priority under 35 USC 119 from Japanese Patent Application No. 2004-189857, the disclosure of which is incorporated by reference herein.

BACKGROUND OF THE INVENTION

1. Field of the Invention

The present invention relates to a luminescent device that emits light by converting electric energy to light. The luminescent device of the invention can, in particular, be suitably used as an organic electroluminescent (EL) device.

2. Description of the Related Art

Organic electroluminescent (EL) devices are attracting attention as promising display devices because they provide luminescence with high brightness at a low voltage. An organic electroluminescent device capable of emitting light with high brightness has been disclosed (for example, in Japanese Patent Application Laid-Open (JP-A) No. 2002-324679), which is produced by a wet method using a luminescent dopant having a relatively larger solubility in a solvent, because a dry method (vapor-deposition method) for the production of a thin film lamination is inferior in improvement of production efficiency due to the complexity of the production process. Further, organic electroluminescent devices that are even more improved in terms of luminescent brightness and durability are demanded.

In order to produce an organic electroluminescent device having an organic layer having a multilayer structure, it is necessary when forming a luminescent layer by the wet method that a solvent is selected that can dissolve a dopant at a sufficient concentration without also dissolving a lower layer that has already been formed. Further, when forming a luminescent layer by the wet method, such problems exist as nonuniformity occurring in a layer due to evaporation of the solvent in a drying step after coating, and there is difficulty in maintaining a constant layer thickness. There are also cases where impurities, oxygen and water contained in the solvent, the binder or the like adversely affect the luminescent layer to cause deterioration both of luminescent brightness and of the durability of the luminescent device.

SUMMARY OF THE INVENTION

The present invention provides an organic electroluminescent device that has high brightness (i.e., high luminescent efficiency) and high driving durability by employing a luminescent layer produced by a vapor-deposition method, and provides a method for producing the same.

A first aspect of the invention provides an organic electroluminescent device including a luminescent layer produced by a vapor-deposition method (a vapor-deposition luminescent layer) disposed between a pair of electrodes, the luminescent layer containing at least one host material and at least one metal complex including a partial structure represented by formula (I):

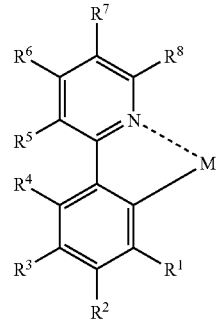

Formula (I)

wherein M represents a metal atom, $R^1$, $R^2$ and $R^4$ to $R^8$ each independently represent a hydrogen atom or a substituent, and $R^3$ represents a group represented by formula (II), an alkoxy group or an aryloxy group:

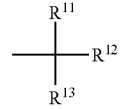

Formula (II)

wherein $R^{11}$ to $R^{13}$ each independently represent a hydrogen atom or a substituent, provided that at least two of them each independently represent an alkyl group or an aryl group.

A second aspect of the invention provides a process for producing an organic electroluminescent device including a luminescent layer disposed between a pair of electrodes, the process including vapor-depositing at least one host material and at least one metal complex including a partial structure represented by formula (I) to form the luminescent layer:

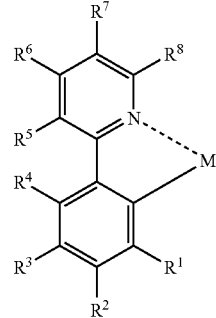

Formula (I)

wherein M represents a metal atom, $R^1$, $R^2$ and $R^4$ to $R^8$ each independently represent a hydrogen atom or a substituent, and $R^3$ represents a group represented by formula (II), an alkoxy group or an aryloxy group:

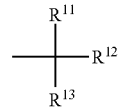

Formula (II)

wherein $R^{11}$ to $R^{13}$ each independently represent a hydrogen atom or a substituent, provided that at least two of them each independently represent an alkyl group or an aryl group.

DETAILED DESCRIPTION OF THE INVENTION

The organic electroluminescent device of the invention is an organic electroluminescent device having a luminescent layer produced by a vapor-deposition method, and the luminescent layer contains a metal complex including a partial structure represented by formula (I) (hereinafter, simply sometimes referred to as a metal complex).

The luminescent layer is produced by a vapor-deposition method and contains a metal complex including a partial structure represented by formula (I) (hereinafter, simply sometimes referred to as partial structure (I)), whereby the advantages of the invention can be exerted; namely, a luminescent device can be provided that has luminescent efficiency and brightness maintained at high levels and has considerably high driving durability.

<Metal Complex Including Partial Structure (I)>

The metal complex including partial structure (I) will be described in detail below.

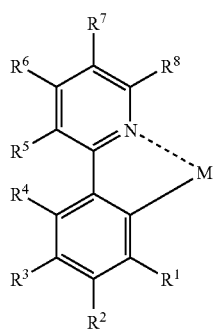

Formula (I)

In formula (I), M represents a metal. The metal is not particularly limited, and is preferably one selected from the group consisting of a rare earth metal, Ru, Rh, Pd, Ag, W, Re, Os, Ir, Pt and Au, and is more preferably Ir or Pt. In formula (1), $R^1$, $R^2$ and $R^4$ to $R^8$ each independently represent a hydrogen atom or a substituent.

Examples of the substituents for $R^1$, $R^2$ and $R^4$ to $R^8$ include an alkyl group (preferably having 1 to 30 carbon atoms, more preferably having 1 to 20 carbon atoms, and particularly preferably having 1 to 10 carbon atoms, such as methyl, ethyl, isopropyl, tert-butyl, n-octyl, n-decyl, n-hexadecyl, cyclopropyl, cyclopentyl, cyclohexyl, trifluoromethyl, and pentafluoromethyl); an alkenyl group (preferably having 2 to 30 carbon atoms, more preferably having 2 to 20 carbon atoms, and particularly preferably having 2 to 10 carbon atoms, such as vinyl, allyl, 2-butenyl, and 3-pentenyl); an alkynyl group (preferably having 2 to 30 carbon atoms, more preferably having 2 to 20 carbon atoms, and particularly preferably having 2 to 10 carbon atoms, such as propargyl and 3-pentynyl); an aryl group (preferably having 6 to 30 carbon atoms, more preferably having 6 to 20 carbon atoms, and particularly preferably having 6 to 12 carbon atoms, such as phenyl, p-methylphenyl, naphthyl, and anthranyl); an amino group (preferably having 0 to 30 carbon atoms, more preferably having 0 to 20 carbon atoms, and particularly preferably having 0 to 10 carbon atoms, such as amino, methylamino, dimethylamino, diethylamino, dibenzylamino, diphenylamino, and ditolylamino); an alkoxy group (preferably having 1 to 30 carbon atoms, more preferably having 1 to 20 carbon atoms, and particularly preferably having 1 to 10 carbon atoms, such as methoxy, ethoxy, butoxy, and 2-ethylhexyloxy); an aryloxy group (preferably having 6 to 30 carbon atoms, more preferably having 6 to 20 carbon atoms, and particularly preferably having 6 to 12 carbon atoms, such as phenyloxy, 1-naphthyloxy, and 2-naphthyloxy); a heteroaryloxy group (preferably having 1 to 30 carbon atoms, more preferably having 1 to 20 carbon atoms, and particularly preferably having 1 to 12 carbon atoms, such as pyridyloxy, pyrazyloxy, pyriridyloxy, and quinolyloxy); an acyl group (preferably having 1 to 30 carbon atoms, more preferably having 1 to 20 carbon atoms, and particularly preferably having 1 to 12 carbon atoms, such as acetyl, benzoyl, formyl, and pivaloyl); an alkoxycarbonyl group (preferably having 2 to 30 carbon atoms, more preferably having 2 to 20 carbon atoms, and particularly preferably having 2 to 12 carbon atoms, such as methoxycarbonyl and ethoxycarbonyl); an aryloxycarbonyl group (preferably having 7 to 30 carbon atoms, more preferably having 7 to 20 carbon atoms, and particularly preferably having 7 to 12 carbon atoms, such as phenyloxycarbonyl); an acyloxy group (preferably having 2 to 30 carbon atoms, more preferably having 2 to 20 carbon atoms, and particularly preferably having 2 to 10 carbon atoms, such as acetoxy and benzoyloxy); an acylamino group (preferably having 2 to 30 carbon atoms, more preferably having 2 to 20 carbon atoms, and particularly preferably having 2 to 10 carbon atoms, such as acetylamino and benzoylamino); an alkoxycarbonylamino group (preferably having 2 to 30 carbon atoms, more preferably having 2 to 20 carbon atoms, and particularly preferably having 2 to 12 carbon atoms, such as methoxycarbonylamino); an aryloxycarbonylamino group (preferably having 7 to 30 carbon atoms, more preferably having 7 to 20 carbon atoms, and particularly preferably having 7 to 12 carbon atoms, such as phenyloxycarbonylamino); a sulfonylamino group (preferably having 1 to 30 carbon atoms, more preferably having 1 to 20 carbon atoms, and particularly preferably having 1 to 12 carbon atoms, such as methanesulfonylamino and benzenesulfonylamino); a sulfamoyl group (preferably having 0 to 30 carbon atoms, more preferably having 0 to 20 carbon atoms, and particularly preferably having 0 to 12 carbon atoms, such as sulfamoyl, methylsulfamoyl, dimethylsulfamoyl, and phenylsulfamoyl); a carbamoyl group (preferably having 1 to 30 carbon atoms, more preferably having 1 to 20 carbon atoms, and particularly preferably having 1 to 12 carbon atoms, such as carbamoyl, methylcarbamoyl, diethylcarbamoyl, and phenylcarbamoyl); an alkylthio group (preferably having 1 to 30 carbon atoms, more preferably having 1 to 20 carbon atoms, and particularly preferably having 1 to 12 carbon atoms, such as methylthio and ethylthio); an arylthio group (preferably having 6 to 30 carbon atoms, more preferably having 6 to 20 carbon atoms, and particularly preferably having 6 to 12 carbon atoms, such as phenylthio); a heteroarylthio group (preferably having 1 to 30 carbon atoms, more preferably having 1 to 20 carbon atoms, and particularly preferably having 1 to 12 carbon atoms, such as pyridylthio, 2-benzimizolylthio, 2-benzoxazolylthio, and 2-benzthiazolylthio); a sulfonyl group (preferably having 1 to 30 carbon atoms, more preferably having 1 to 20 carbon atoms, and particularly preferably having 1 to 12 carbon atoms, such as mesyl and tosyl); a sulfinyl group (preferably having 1 to 30 carbon atoms, more preferably having 1 to 20 carbon atoms, and particularly preferably having 1 to 12 carbon atoms, such as methanesulfinyl and benzenesulfinyl); an ureido group (preferably having 1 to 30 carbon atoms, more preferably having 1 to 20 carbon atoms, and particularly preferably having 1 to 12 carbon atoms, such as ureido, methylureido, and phenylureido); a phosphoric amide group (preferably having 1 to 30 carbon atoms, more preferably having 1 to 20 carbon atoms, and particularly preferably having 1 to 12 carbon atoms, such as diethylphosphoric amide and phenylphosphoric amide); a hydroxy group; a mercapto group; a halogen atom (such as a fluorine atom, a chlorine atom, a bromine atom, and an iodine atom); a cyano group; a sulfo group; a carboxyl group; a nitro group; a hydroxamic acid group; a sulfino group; a hydrazino group; an imino group; a heterocyclic group (preferably having 1 to 30 carbon atoms, and more preferably having 1 to 12 carbon atoms, with examples of the heteroatom including a nitrogen atom, an oxygen atom and a sulfur atom, and specific examples of the heterocyclic group including imidazolyl, pyridyl, quinolyl, furyl, thienyl, piperidyl, morpholino, benzoxazolyl, benzimidazolyl and benzthiazolyl); and a silyl group (preferably having 3 to 40 carbon atoms, more preferably having 3 to 30 carbon atoms, and particularly preferably having 3 to 24 carbon atoms, such as trimethylsilyl and triphenylsilyl). These substituents may each further have a substituent. Two of the substituents may be bonded to each other to form a condensed ring structure.

$R^1$, $R^2$ and $R^4$ to $R^8$ are preferably each independently selected from a hydrogen atom, an alkyl group, an aryl group, an alkoxy group, an aryloxy group, a heterocyclic group, a silyl group and a halogen atom or form a benzo condensed ring structure by bonding two of the substituents, and are more preferably each independently a hydrogen atom, an alkyl group having 1 to 10 carbon atoms, an aryl group having 6 to 12 carbon atoms, an alkoxy group having 1 to 10 carbon atoms, an aryloxy group having 6 to 12 carbon atoms, a heterocyclic group having 1 to 12 carbon atoms containing a nitrogen atom, an oxygen atom or a sulfur atom as a heteroatom, a fluorine atom or a chlorine atom. It is particularly preferred that $R^1$, $R^2$ and $R^4$ to $R^8$ are each a hydrogen atom. It is also preferable that two of $R^5$ to $R^8$ which are adjacent to each other are bonded to each other to form a benzo condensed ring structure, and more preferable that $R^5$ and $R^6$ are bonded to each other to form a benzo condensed ring structure. Further, it is preferable that at least one of $R^1$, $R^2$, and $R^4$ is a fluorine atom, and more preferable that $R^2$ and $R^4$ each are a fluorine atom.

$R^3$ represents a group represented by the formula (II), an alkoxy group or an aryloxy group.

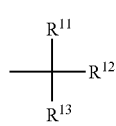

Formula (II)

In formula (II), $R^{11}$ to $R^{13}$ each independently represent a hydrogen atom or a substituent, provided that at least two of them each independently represent an alkyl group or an aryl group.

The substituents for $R^{11}$ to $R^{13}$ are the same as the substituent for $R^1$, and the preferred range thereof is also the same. At least two of $R^{11}$ to $R^{13}$ may be bonded to each other to form a ring.

The alkoxy group and the aryloxy group for $R^3$ are the same as the alkoxy group and the aryloxy group for $R^1$, and the preferred range thereof is also the same.

$R^3$ is preferably a group represented by formula (II), more preferably at least two of $R^{11}$ to $R^{13}$ in formula (II) each are an alkyl group, and yet more preferably each of $R^{11}$ to $R^{13}$ are an alkyl group. The alkyl group herein is the same as the alkyl group for $R^1$, and is preferably an alkyl group having 1 to 10 carbon atoms, and more preferably an alkyl group having 1 to 5 carbon atoms (such as methyl, ethyl, propyl, isopropyl, t-butyl or neopentyl).

Among the groups represented by formula (II), $R^3$ is preferably a tertiary alkyl group (such as t-butyl, 1,1-dimethylpropyl, 1,1,3,3-tetramethylbutyl or 1-methylcyclopropyl), more preferably a tertiary alkyl group having 4 to 30 carbon atoms, and most preferably a tertiary alkyl group having 5 to 20 carbon atoms.

Example compounds of the metal complex in the invention are shown below, but the invention is not limited thereto.

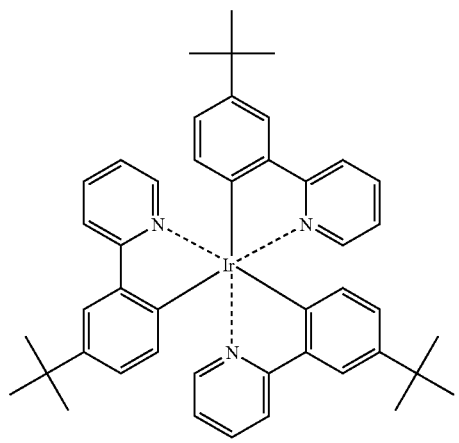

Ir-1

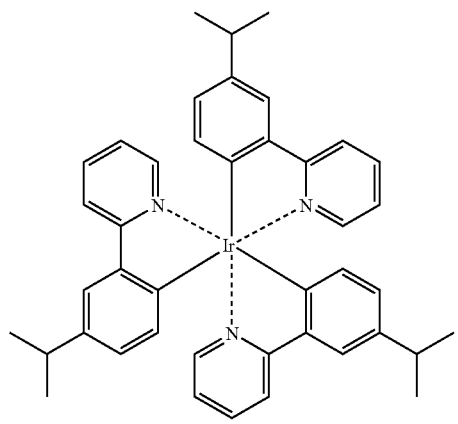

Ir-2

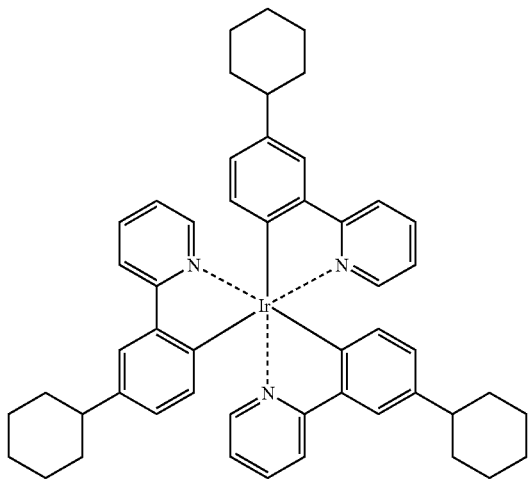

Ir-3

-continued
Ir-4
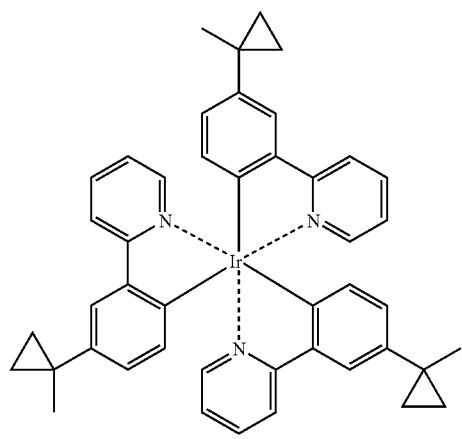
Ir-5
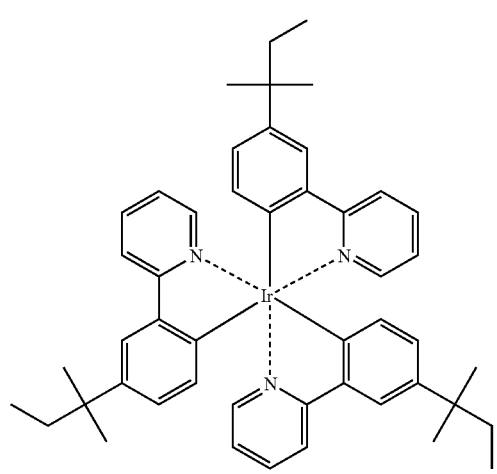
Ir-6
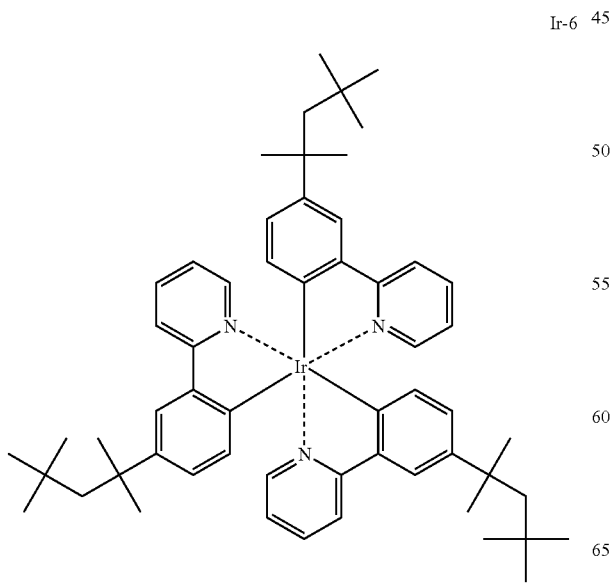
-continued
Ir-7
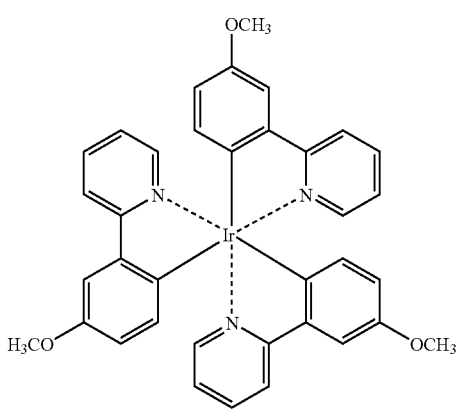
Ir-8
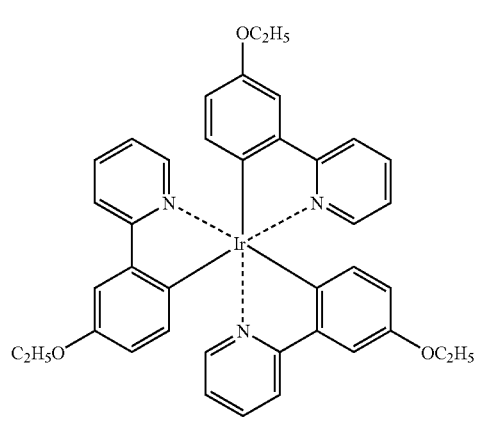
Ir-9
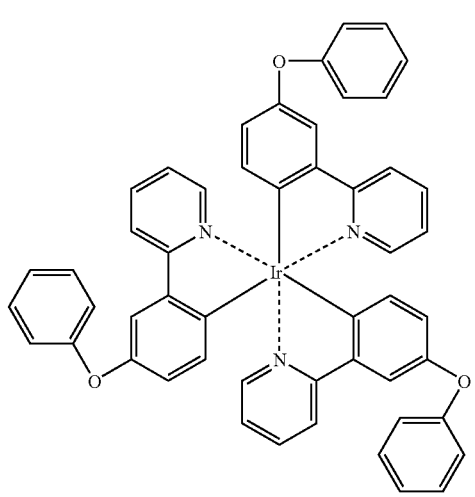

-continued

Ir-10
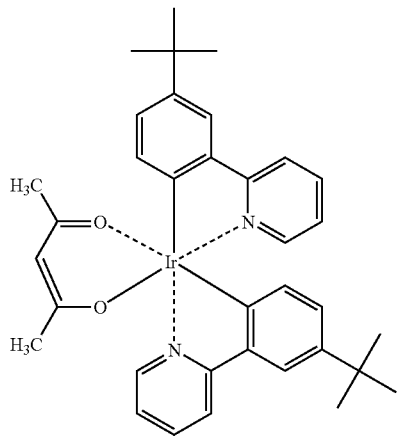

Ir-11
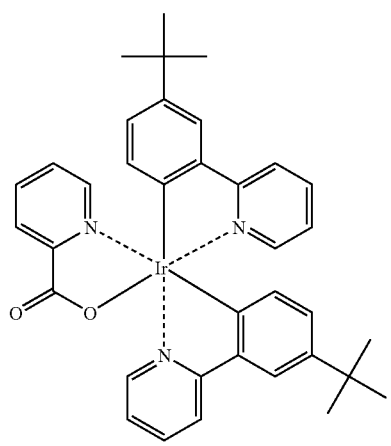

Ir-12
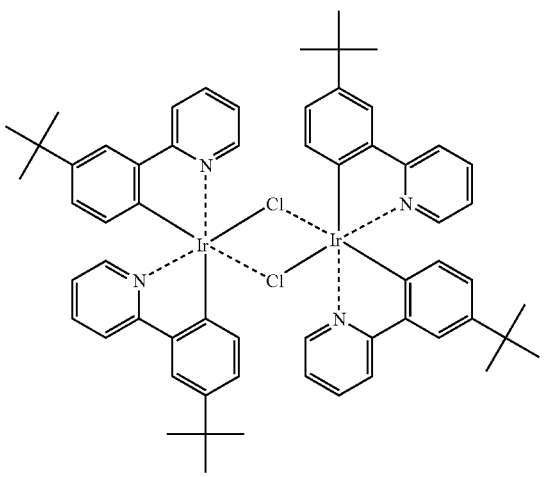

-continued

Ir-13
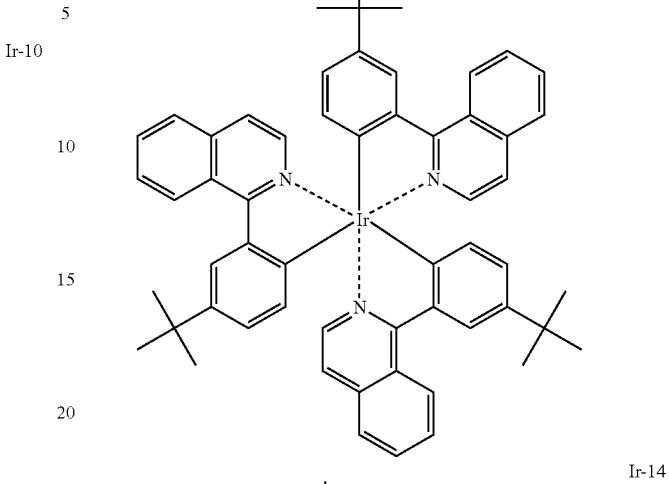

Ir-14
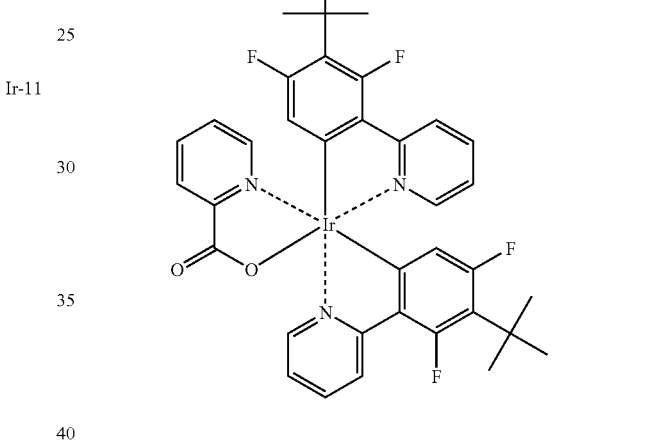

The metal complex in the invention can be synthesized using various methods.

For example, it can be synthesized by reacting a ligand or a dissociated product thereof with a metallic compound in the presence or absence of a solvent (such as a halogen solvent, an alcohol solvent, an ether solvent, an ester solvent, a ketone solvent, a nitrile solvent or water) or in the presence or absence of a base (including various inorganic and organic bases, such as sodium methoxide, t-butoxypotassium, triethylamne or potassium carbonate) at room temperature or lower or under heating (in which a heating method using microwaves is also effective in addition to the ordinary heating method).

<Luminescent Device>

The luminescent device including the metal complex in the invention will be described.

The luminescent device of the invention is not particularly limited in system, driving method and use mode, insofar as the device utilizes the metal complex including partial structure (I). Representative examples of the luminescent device include an organic EL (electroluminescent) device.

The luminescent device of the invention includes a pair of electrodes, i.e., a positive electrode and a negative electrode, between which at least a luminescent layer is provided, and the device may further include other layers by forming plural organic compound layers including the luminescent layer.

As an example of the other layers, a hole transport layer is preferably provided, and furthermore, a hole injection layer, an electron injection layer, an electron transport layer and a protective layer may be provided. Each of these layers may also have other functions, and layers having the same function may be accumulated. The layers may be formed by using various kinds of materials.

(Positive Electrode)

The positive electrode supplies holes to the hole injection layer, the hole transport layer, and/or the luminescent layer. The positive electrode can be made from a metal, an alloy, a metal oxide, an electrically conductive compound, or a mixture thereof, and is preferably made of a material having a work function of 4 eV or more.

Specific examples of the material of the positive electrode include electrically conductive metal oxides such as tin oxide, zinc oxide, indium oxide, and ITO; metals such as gold, silver, chromium, and nickel; mixtures and laminated products of these metals and the electrically conductive metal oxides; electrically conductive inorganic substances such as copper iodide, and copper sulfide; electrically conductive organic substances such as polyaniline, polythiophene, and polypyrrole; and laminated products of the electrically conductive organic substances and ITO. The material of the positive electrode is preferably an electrically conductive metal oxide. The material is more preferably ITO from the viewpoints of productivity, high electrical conductivity, transparency and the like.

The thickness of the positive electrode can be suitably determined according to the material of the positive electrode, but is preferably 10 nm to 5 μm, more preferably 50 nm to 1 μm, and still more preferably 100 to 500 nm.

The positive electrode is usually an article having a layer of at least one of the above-described materials on a substrate made of soda lime glass, no-alkali glass, or a transparent resin. When the substrate is made of glass, the glass is preferably no-alkali glass in order to reduce ions deriving from the glass. When the substrate is made of soda lime glass, the substrate is preferably coated with a barrier coating such as silica. When the substrate is made of transparent resin, examples of the transparent resin substrate include polymeric materials including polyesters such as polyethylene terephthalate, polybutylene terephthalate and polyethylene naphthalate, polyethylene, polycarbonate, polyethersulfone, polyarylate, allyldiglycolcarbonate, polyimide, polycycloolefin, norbornene resins, poly(chloro-trifluoroethylene), TEFRON (polytetrafluoroethylene) and polytetrafluoroethylene-polyethylene copolymers.

The thickness of the substrate is not limited, as long as the substrate has sufficient mechanical strength. However, when the substrate is made of glass, the thickness thereof is generally 0.2 mm or more, and preferably 0.7 mm or more.

A method for producing a positive electrode is selected according to the material of the positive electrode. When the positive electrode is an ITO film, the ITO film may be formed by an electron beam method, a sputtering method, a resistance heating deposition method, a chemical reaction method (e.g., a sol-gel method), or a method of applying a dispersion of indium tin oxide.

The positive electrode can be subjected to washing or other treatment to lower the driving voltage of the device and/or to enhance luminescence efficiency. When the positive electrode is made of ITO, for example, UV-ozone treatment or plasma treatment is effective.

(Negative Electrode)

The negative electrode supplies electrons to the electron injection layer, the electron transport layer, and/or the luminescent layer, and the material of the negative electrode is selected in consideration of adhesion between the negative electrode and a layer adjacent to the negative electrode, such as the electron injection layer, the electron transport layer, and/or the luminescent layer, and ionization potential and stability of the material.

The negative electrode can be made from a metal, an alloy, a metal halide, a metal oxide, an electrically conductive compound, or a mixture thereof. Specific examples of the material of the negative electrode include alkali metals such as lithium, sodium, potassium, and fluorides and oxides thereof; alkaline earth metals such as magnesium, calcium, and fluorides and oxides thereof; gold, silver, lead, aluminum, a sodium-potassium alloy, and mixed metals of these materials; a lithium-aluminum alloy and mixed metals including the lithium-aluminum alloy; a magnesium-silver alloy and mixed metals including the magnesium-silver alloy; and rare earth metals such as indium and ytterbium. The negative electrode is preferably made of a material selected from the above materials and has a work function of 4 eV or less. The material of the negative electrode is more preferably aluminum, a lithium-aluminum alloy or a mixed metal including the lithium-aluminum alloy, or a magnesium-silver alloy or a mixed metal including the magnesium-silver alloy.

The negative electrode can be one layer of any of the above-described materials or multilayers including one or more of the above-described materials. For example, the negative electrode preferably has a layered structure of aluminum/lithium fluoride, or aluminum/lithium oxide.

The thickness of the negative electrode can be suitably determined according to the material of the negative electrode. However, the thickness is preferably 10 nm to 5 μm, more preferably 50 nm to 1 μm, and still more preferably 100 nm to 1 μm.

The negative electrode is formed by an electron beam method, a sputtering method, a resistance heating deposition method, a coating method, or a transferring method. One metal can be vapor-deposited, or at least two metals can be vapor-deposited simultaneously. In order to form an alloy electrode, at least two metals can be vapor-deposited simultaneously, or an alloy prepared in advance can be vapor-deposited.

The sheet resistance of each of the positive and negative electrodes is preferably low, and, specifically, is preferably several hundred ohm/sq or less.

(Luminescent Layer)

The materials of the luminescent layer are materials that can form a layer having a function of receiving holes from the positive electrode, the hole injection layer or the hole transport layer and receiving electrons from the negative electrode, the electron injection layer or the electron transport layer when an electric field is applied to the device, a function of transporting the injected charges and a function of providing a field where holes are recombined with electrons to emit light. The luminescent layer may be made of a single substance or a combination of plural substances. It is preferable that a charge transport material (host material) is doped with a luminescent material as a dopant, either to obtain superior performance by separating the charge transporting function and the luminescent function, or to prevent the phenomenon of radiationless quenching (concentration quenching) from occurring, whereby aggregation occurs in the luminescent material at a high concentration and deactivates the excited state without radiation.

The luminescent layer of the invention containing the metal complex including partial structure (I) and the host material preferably contains the metal complex in a concentration of from 1 to 15% by mass, more preferably from 2 to 10% by mass, and yet more preferably from 3 to 8% by mass.

In cases where the concentration of the metal complex is less than the above-described range, there may be cases where sufficient luminescent brightness cannot be obtained, and the host material is liable to emit light at an undesirable wavelength. In cases where the concentration of the metallic complex exceeds the above-described range, the luminescent efficiency is liable to deteriorate due to concentration quenching, and the charges flow in the metallic complex making it liable to decompose, whereby driving durability tends to deteriorate.

The metal complex may be used singly or in combination of plural kinds thereof.

—Host Material—

The luminescent layer contains the host material in addition to the metal complex of the invention, and from the standpoint of holes and/or electrons transport properties, the luminescent layer preferably contains, for example, at least one kind of the host material selected from the group consisting of a carbazole derivative (described, for example, in Applied Physics Letters, Vol. 74, No. 3, p. 442 (1999)), a tribenzoazepine derivative (described in JP-A Nos. 10-59943, 10-219241, 10-316875, 10-324680, 10-330365 and 2001-97953), a triazole derivative (described in U.S. Pat. No. 3,112,197), an oxazole derivative (described in U.S. Pat. No. 3,257,203), an imidazole derivative (described in Japanese Patent Application Publication (JP-B) No. 37-16096), a polyarylalkane derivative (described in U.S. Pat. Nos. 3,615, 402, 3,820,989 and 3,542,544, JP-B Nos. 45-555 and 51-10983, and JP-A Nos. 51-93224, 55-17105, 56-4148, 55-108667, 55-156953 and 56-36656), a polyarylbenzenoid derivative (described in JP-A Nos. 10-255985 and 2002-260861), an arylamine derivative (described in U.S. Pat. Nos. 3,567,450, 3,180,703, 3,240,597, 3,658,520, 4,232,103, 4,175,961 and 4,012,376, JP-B Nos. 49-35702 and 39-27577, JP-A Nos. 55-144250, 56-119132, 56-22437 and West German Patent No. 1,110,518), a styrylanthracene derivative (described in JP-A No. 56-46234), a stilbene derivative (described in JP-A Nos. 61-210363, 61-228451, 61-14642, 61-72255, 6247646, 62-36674, 62-10652, 62-30255, 60-93445, 60-94462, 60-174749 and 60-175052), an aromatic tertiary amine compound and a styrylamine compound (described in JP-A Nos. 63-295695, 53-27033, 54-58445, 54-149634, 54-64299, 55-79450, 55-144250, 56-119132, 61-295558, 61-98353 and 8-239655 and U.S. Pat. No. 4,127, 412), an aromatic dimethylidene compound (described in JP-A No. 6-330034), a pyrazoline derivative and a pyrazolone derivative (described in U.S. Pat. Nos. 3,180,729 and 4,278, 746, and JP-A Nos. 55-88064, 55-88065, 49-105537, 55-51086, 56-80051, 56-88141, 57-45545, 54-112637 and 55-74546), a phenylenediamine derivative (described in U.S. Pat. No. 3,615,404, JP-B Nos. 51-10105, 46-3712 and 47-25336, and JP-A Nos. 54-53435, 54-110536 and 54-119925), an amino-substituted chalcone derivative (described in U.S. Pat. No. 3,526,501), a fluorenone derivative (described in JP-A No. 54-110837), a hydrazone derivative (described in U.S. Pat. No. 3,717,462 and JP-A Nos. 54-59143, 55-52063, 55-52064, 55-46760, 55-85495, 57-11350 and 57-148749), a silazane derivative (described in U.S. Pat. No. 4,950,950), a porphyrin compound (described in JP-A No. 63-295695), an anthraquinodimethane derivative and anthrone derivative (described in JP-A Nos. 57-149259, 58-55450, 63-104061, 61-225151 and 61-233750), a diphenoquinone derivative, a thiopyran dioxide derivative and a carbodiimide derivative (described in Polymer Preprints, Japan, Vol. 37, No. 3, p. 681 (1988)), a fluorenylidene methane derivative (described in JP-A Nos. 60-69657, 61-143764 and 61-148159), a distyrylpyrazine derivative (described in Chemistry Letters, 1990, p. 189, JP-A Nos. 2-252793 and 5-178842), a heterocyclic tetracarboxylic anhydride derivative (described in Japanese Journal of Applied Physics, Vol. 27, L269 (1988)), porphyrin and a phthalocyanine derivative (described in JP-A No. 63-2956965), a metal complex of an 8-quinolinol derivative (described in IEICE Transactions (The Institute of Electronics, Information and Communication Engineers (Japan)), 1990, C-2, p. 661), a metal complex having benzoxazole as a ligand, and a metal complex having benzothiazole as a ligand (the disclosures of the above patent documents and the above literatures being incorporated by reference herein). Among these, a carbazole derivative is more preferably used.

In order to effectively attain energy transfer from the triplet excited state of the host material to the luminescent material, it is preferred that the energy level of the minimum triplet excited state ($T_1$ level) of the host material is higher than the $T_1$ level of the luminescent material. The $T_1$ level of the luminescent material is higher when the luminescent wavelength thereof is shorter, and thus a host material having a high $T_1$ level is necessary in a luminescent layer of a luminescent device for a short wavelength. On the other hand, the $T_1$ level relates to the highest occupied molecular orbital (HOMO) and the lowest unoccupied molecular orbital (LUMO) of the host material, which relate to the capabilities of injection and transport of the charge (i.e., in general, when the energy difference between HOMO and LUMO is larger, it is difficult for the charge to be injected, and electric insulation increases). Accordingly, it is important that a host material having the optimum $T_1$ level is selected.

In particular, the host material for the luminescent layer for a blue luminescent device having a luminescent maximum wavelength of 500 nm or less preferably has a $T_1$ level of 62 kcal/mol or more (259 kJ/mol or more) and 85 kcal/mol or less (355 kJ/mol or less), and more preferably 65 kcal/mol or more (272 kJ/mol or more) and 80 kcal/mol or less (334 kJ/mol or less).

As the host material for the luminescent device of the invention that satisfies the above-described values, the host materials disclosed in JP-A Nos. 2002-100476 and 2002-338579, the disclosures of which are incorporated by reference herein, are preferred, and the host materials disclosed in JP-A No. 2002-100476 are more preferred. The preferred range of the host materials disclosed in JP-A No. 2002-100476 is as described therein.

The luminescent layer of the invention is produced by a vapor-deposition method. The vapor-deposition method is generally such that a substance is evaporated by heating under a high vacuum ($10^{-2}$ Pa or less), and the vaporized substance is deposited on a target to form a layer. Examples of the heating method for evaporating a substance from an evaporation source include a resistance heating method, a high-frequency heating method, an electron beam heating method and a laser heating method, and a resistance heating method is most ordinarily used. Examples of a method for evaporating a substance other than heating include a sputtering method, an ion plating method and a molecular beam epitaxy method, which may be selected according to purpose. A CVD method, in which a layer is formed through chemical reaction on a surface of a target, is also included in the vapor-deposition method in the broad sense, and the vapor-deposition method referred in the invention encompasses all of these vapor-deposition techniques. The vapor-deposition method is described in detail in "Shinban Shinku Handbook (Vacuum Handbook, New Edition)", Chapter 8, edited by Ulvac, Inc., published by Ohmsha, Ltd., the disclosure of which is incorporated by reference herein.

In cases where a layer is formed with a mixture of two or more kinds of substance, plural substances may be placed in one evaporation source and then evaporated, but according to this method, the composition of the substances in the evaporated gas is difficult to maintain constant and, therefore, the general practice is that molecules of the plural substances are simultaneously evaporated from separate evaporation sources. A method is also known whereby plural substances are sequentially laminated on a heated substrate, and the layers are formed into a uniform single layer by utilizing diffusion under heat (as described in Japanese Patent No. 3,362,504, the disclosure of which is incorporated by reference herein).

A luminescent layer produced by the vapor-deposition method is excellent in luminescent brightness and driving durability in comparison to a luminescent layer produced by the wet film forming method, represented by a spin coating method and an inkjet method, because the layer is free from impurities, oxygen and water derived from the solvent or the binder, and furthermore, such a layer is free from a problem wherein a lower layer that has already been formed is dissolved by the solvent. Accordingly, a uniform luminescent layer having a desired thickness can be easily obtained.

Moreover, by applying masking when vapor-depositing, the luminescent layer produced by the vapor-deposition method is suitable for producing a full-color display with high precision and high image quality because different luminescent materials and host materials may be used for the respective pixels to impart different luminescent capabilities thereto.

In view of the formation of the luminescent layer of the invention by the vapor-deposition method, it is preferred that the material of the luminescent layer contains only materials having a molecular weight of 3,000 or less. In particular, polymeric materials including polymers and oligomers are not preferred because they are difficult to be vapor-deposited due to their low volatility, and are difficult to provide luminescence with good reproducibility due to the molecular weight distribution of the materials.

The metal complex including partial structure (I) preferably has a molecular weight of 3,000 or less, and in cases where the luminescent layer contains other materials including the host material, the materials each preferably have a molecular weight of 3,000 or less. It is more preferable that all the materials contained in the luminescent layer each have a molecular weight of from 200 to 2,000.

A high molecular weight compound having a molecular weight exceeding 3,000 tends to be difficult to evaporate under heat even in a high vacuum environment, and thus it tends to be difficult to form a layer by the vapor-deposition method.

In cases where a substance having a molecular weight outside the range of from 200 to 2,000 is selected, it tends to be difficult to form a layer using a low molecular weight compound having a molecular weight of less than 200 through vacuum deposition due to the excessively high volatility thereof, and it tends to be difficult to evaporate under heat a high molecular weight compound having a molecular weight exceeding 2,000 even in a high vacuum environment.

The material for the luminescent layer is preferably a neutral molecular compound rather than an ionic compound from the standpoint of easiness of deposition.

The luminescent layer produced by vapor-deposition is preferably a uniform amorphous film free from defects such as detachment and pinholes, and preferably has a high melting point and a high glass transition temperature (Tg) in view of the fact that the performance of the luminescent device is altered or deteriorated when recrystallization occurs with the lapse of time or under heat. The material for the luminescent layer preferably has a melting point of 150° C. or more, more preferably 200° C. or more, and yet more preferably 250° C. or more, and preferably has Tg of 70° C. or more, more preferably 100° C. or more, and yet more preferably 120° C. or more.

As a host material that satisfies all the above-described requirements, a carbazole derivative is most preferred since it has a high $T_1$ level, tends not to suffer crystallization, and has a long life of the excited state such that high luminescent efficiency can be expected.

Examples of the host material in the invention are shown below, but the invention is not limited thereto.

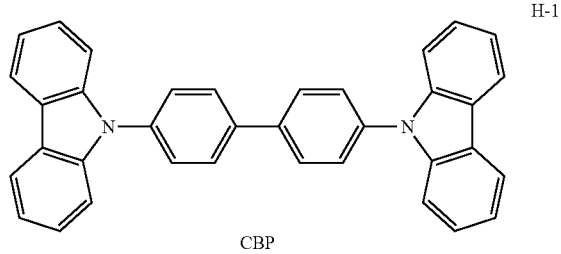

CBP

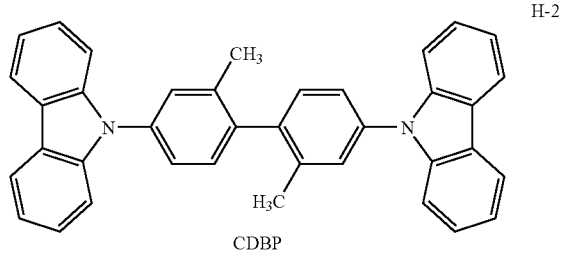

CDBP

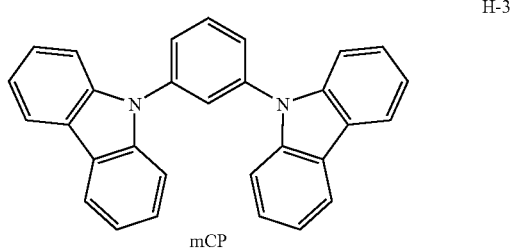

mCP

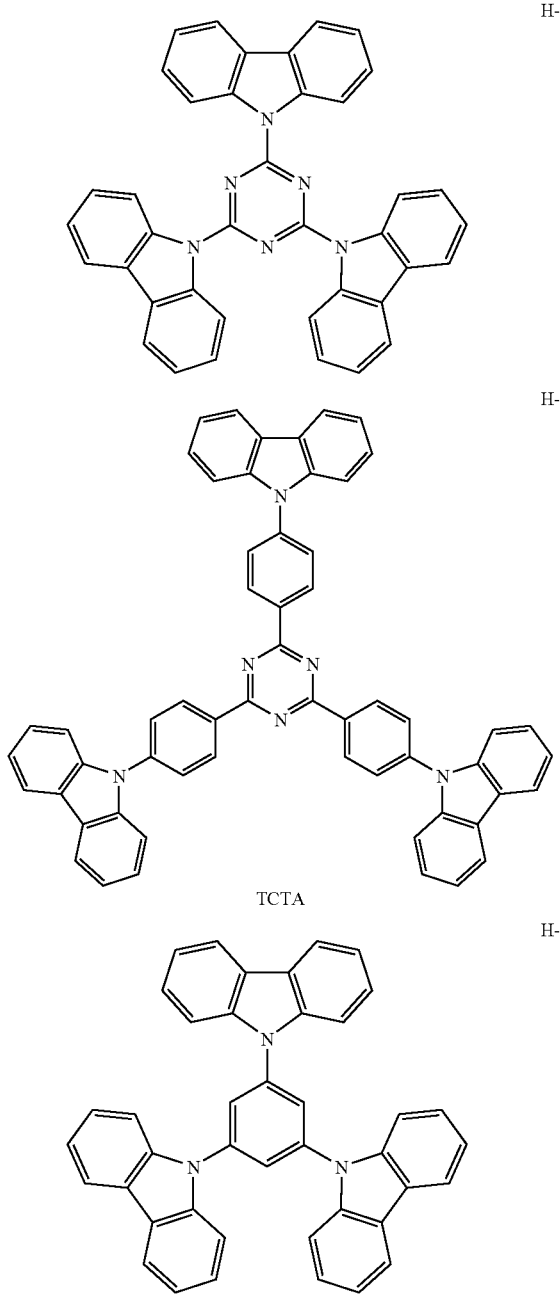

In addition to the above-described compounds, the luminescent layer may contain polyphenyl, diphenylbutadiene, tetraphenylbutadiene, naphthalimide (described in JP-A No. 2-305886), coumarin, perylene (described in JP-A No. 2-189890), perynone, oxadiazole (described in JP-A No. 2-216791, or an oxadiazole derivative disclosed by Hamada, et al. in The 38th JSAP (the Japan Society of Applied Physics) Annual Meeting), an aldazine derivative (described in JP-A No. 2-220393) pyrazoline (described in JP-A No. 2-220394), a metal complex of cyclopentadiene (described in JP-A No. 2-289675), various metal complexes represented by a rare earth complex, an organic silane, a transition metal complex represented by iridium trisphenylpyridine complex and platinum porphyrin complex, and derivatives thereof. The disclosures of the above patent documents and literature are incorporated by reference herein.

The thickness of the luminescent layer is not particularly limited, and in general, it is preferably from 1 nm to 5 μm, more preferably from 5 nm to 1 μm, and yet more preferably from 10 to 500 nm.

The luminescent layer may be constituted by a single layer or plural layers. Each of the plural layers may emit light with different luminescent colors to form white light in total, and the single luminescent layer may emit light with white light. In the case where the luminescent device includes plural luminescent layers, each of the luminescent layers may be formed with a single material or with plural compounds.

(Hole Injection Layer and Hole Transport Layer)

The material of the hole injection layer and the hole transport layer may have at least one of a function for receiving holes from the positive electrode, a function for transporting holes, and a function for blocking electrons injected from the negative electrode.

The material of the hole injection layer and the hole transport layer is preferably at least one kind selected from the group consisting of a tribenzoazepine derivative, a triazole derivative, an oxazole derivative, an oxadiazole derivative, an imidazole derivative, a polyarylalkane derivative, a polyarylbenzene derivative, an arylamine derivative, a styrylanthracene derivative, a stilbene derivative, an aromatic tertiary amine derivative, a styrylamine derivative, an aromatic dimethylidyne derivative, a metal complex of 8-quinolinol derivative, a pyrazoline derivative, a pyrazolone derivative, a phenylenediamine derivative, an amino-substituted chalcone derivative, a fluorenone derivative, a hydrazone derivative, a silazane derivative and a porphyrin derivative. Preferred examples of these compounds include the corresponding compounds described for the host material.

In the case where the hole transport layer is a layer adjacent to the luminescent layer, it is preferred that the energy level of the minimum triplet excited state ($T_1$ level) of the hole transport material is higher than the $T_1$ levels of the luminescent material and the host material of the luminescent layer for preventing triplet excitons generated in the luminescent layer from migrating to the hole transport layer. In particular, the $T_1$ level of the hole transport material for a blue luminescent device having a luminescent maximum wavelength of 500 nm or less is preferably 62 kcal/mol or more (259 kJ/mol or more) and 85 kcal/mol or less (355 kJ/mol or less), and more preferably 65 kcal/mol or more (272 kJ/mol or more) and 80 kcal/mol or less (334 kJ/mol or less).

As hole transport materials that satisfy the above-described values, the hole transport materials disclosed in JP-A No. 2002-100476, the disclosure of which is incorporated by reference herein, are preferred, and the preferred range of the hole transport materials disclosed in JP-A No. 2002-100476 is as described therein.

Among the above-described compounds, a tribenzoazepine derivative is expected to provide high luminescent efficiency owing to the high $T_1$ level thereof, and an arylamine derivative is expected to provide improved durability owing to the high stability thereof. Therefore, the hole transport material is preferably selected from these compounds.

In addition to these compounds, such compounds may be added, depending on necessity, as carbazole, a polysilane compound, an electroconductive polymer or oligomer, such as poly(N-vinylcarbazole), an aniline copolymer and a thiophene oligomer, an organic silane, a carbon film, and derivatives thereof.

The thickness of the hole injection layer is not particularly limited, and in general, it is preferably from 0.2 nm to 1 µm, more preferably from 1 nm to 0.2 µm, and still more preferably from 2 to 100 nm.

The thickness of the hole transport layer is not particularly limited, and in general, it is preferably from 1 nm to 5 µm, more preferably from 5 nm to 1 µm, and still more preferably from 10 to 500 nm.

The hole injection layer and the hole transport layer may have a single layer structure containing one or plural kinds of the above-described compounds, or may have a multilayer structure having plural layers each having the same composition or different compositions.

The hole injection layer and the hole transport layer are formed by a vacuum deposition method, an LB method, a method in which a hole injection or transport material is dissolved or dispersed in a solvent and the resultant coating solution is applied to a substrate or any other layer, an ink-jet method, a printing method, or a transferring method.

In the case of a coating method, the above-described material and a resin component may be dissolved or dispersed in a solvent. Examples of the resin component include polyvinyl chloride, polycarbonate, polystylene, polymetyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethylcellulose, vinyl acetate resins, ABS resins, polyurethane resins, melamine resins, unsaturated polyester resins, alkyd resins, epoxy resins, and silicone resins.

Among the above-described layer forming methods, the hole transport layer is preferably formed by a vapor-deposition method. A layer formed by a vapor-deposition method has a uniform and constant thickness and tends to have improved durability.

In the case where the hole transport layer is formed by a vapor-deposition method, the materials of the hole transport layer are preferably low molecular weight organic compounds having a molecular weight of 3,000 or less and/or low molecular weight organic metal compounds having a molecular weight of 3,000 or less, similarly to the materials of the luminescent layer.

(Electron Injection Layer and Electron Transport Layer)

The material of the electron injection layer and the electron transport layer may have at least one of a function of receiving electrons from the negative electrode, a function of transporting electrons, and a function of blocking electrons injected from the positive electrode.

The luminescent device of the invention preferably has, between the negative electrode and the luminescent layer, a layer containing a compound having an ionization potential of 5.9 eV or more (more preferably 6.0 eV or more), and more preferably has an electron transport layer having an ionization potential of 5.9 eV or more.

Specific examples of that compound include triazole, oxazole, oxadiazole, imidazole, fluorenone, anthraquinodimethane, anthrone, diphenylquinone, thiopyran dioxide, carbodiimide, fluorenylidene methane, distyrylpyrazine, aromatic tetracarboxlic acid anhydride such as naphthalene tetracarboxylic acid anhydride and perylene tetracarboxylic acid anhydride, phthalocyanine, various metallic complexes represented by a metal complex of a 8-quinolinol and a metal complex having metalphthalocyanine benzoxazole or benzothiazole as a ligand, an organic silane, and derivatives thereof.

Preferred examples of these compounds include the preferred examples of the corresponding compounds described for the host material.

By providing a layer containing such a compound (i.e., a blocking layer), reduction in luminescent efficiency and deterioration in durability caused by holes penetrating through the luminescent layer and flowing into the electron transport layer can be prevented from occurring.

In cases where the electrontransport layer is a layer adjacent to the luminescent layer, it is preferred that the energy level of the minimum triplet excited state ($T_1$ level) of the electron transport material is higher than the $T_1$ levels of the luminescent material and the host material of the luminescent layer for preventing triplet excitons generated in the luminescent layer from migrating to the electron transport layer. In particular, the $T_1$ level of the electron transport material for a blue luminescent device having a luminescent maximum wavelength of 500 nm or less is preferably 62 kcal/mol or more (259 kJ/mol or more) and 85 kcal/mol or less (355 kJ/mol or less), and more preferably 65 kcal/mol or more (272 kJ/mol or more) and 80 kcal/mol or less (334 kJ/mol or less).

As electron transport materials that satisfy the above-described values, the electron transport materials disclosed in JP-A No. 2002-100476 are preferred, and the preferred range of the electron transport materials disclosed in JP-A No. 2002-100476 is as described therein.

In addition to these compounds, such compounds may be added, depending on necessity, as carbazole, a polysilane compound, an electroconductive polymer or oligomer, such as poly(N-vinylcarbazole), an aniline copolymer and a thiophene oligomer, an organic silane, a carbon film, and derivatives thereof.

The thickness of the electron injection layer is not particularly limited, and in general, it is preferably from 0.2 nm to 1 µm, more preferably from 1 nm to 0.2 µm, and still more preferably from 2 to 100 nm.

The thickness of the electron transport layer is not particularly limited, and in general, it is preferably from 1 nm to 5 µm, more preferably from 5 nm to 1 µm, and still more preferably from 10 to 500 nm.

The electron injection layer and the electron transport layer may have a single layer structure containing one or plural kinds of the above-described compounds, or may have a multilayer structure having plural layers each having the same composition or different compositions.

The electron injection layer and the electron transport layer are formed by a vacuum deposition method, an LB method, a method in which an electron injection or transport material is dissolved or dispersed in a solvent and the resultant coating solution is applied to a substrate or any other layer, an ink-jet method, a printing method, or a transferring method.

In the case of a coating method, the above-described material and a resin component may be dissolved or dispersed in a solvent. Examples of the resin component include those exemplified for the hole injection layer.

Among the above-described layer forming methods, the electron transport layer is preferably formed by a vapor-deposition method. A layer formed by a vapor-deposition method has a uniform and constant thickness and tends to have improved durability.

In cases where the electron transport layer is formed by a vapor-deposition method, the materials of the electron transport layer are preferably low molecular weight organic compounds having a molecular weight of 3,000 or less and/or low molecular weight organic metal compounds having a molecular weight of 3,000 or less, similarly to the materials of the luminescent layer.

(Protective Layer)

The luminescent device of the invention may include a protective layer to prevent moisture and oxygen from entering the device.

The material of the protective layer may have a function of preventing substances that accelerate deterioration of the device, such as moisture and oxygen, from entering the device.

Specific examples thereof include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; nitrides such as $SiN_x$ and $SiO_xN_y$; polyethylene, polypropylene, polymethyl methacrylate, polyimide, polyurea, polytetrafluoroethylene, polychloro-trifluoroethylene, polydichloro-difluoroethylene, a chloro-trifluoroethylene/dichloro-difluoroethylene copolymer, a copolymer obtained by copolymerizing a monomer mixture including tetrafluoroethylene and at least one comonomer, fluorinated copolymers having a ring structure in the main chain of the copolymer, water-absorbing substances having a coefficient of water absorption of at least 1%, and moisture-preventive substances having a coefficient of water absorption of at most 0.1%.

The method for forming the protective layer is not particularly limited. Examples thereof include a vacuum deposition method, a sputtering method, a reactive sputtering method, a molecular beam epitaxy (MBE) method, a cluster ion beam method, an ion-plating method, a plasma polymerization method (radio frequency excitation ion-plating method), a plasma CVD method, a laser CVD method, a thermal CVD method, a gas source CVD method, a coating method, a printing method, and a transferring method.

The method for producing an organic electroluminescent device of the invention is a method for producing an organic electroluminescent device including a luminescent layer disposed between a pair of electrodes, and the method includes vapor-depositing at least one host material and at least one metal complex including partial structure (I) to form the luminescent layer.

As an embodiment of the method for producing an organic electroluminescent device of the invention, a method for forming a luminescent layer by co-vapor-depositing a metal complex and a host material will be described below, but the invention is not limited thereto.

A substrate having an ITO thin film as a transparent electrode is cleaned with a solvent and then subjected to a UV-ozone treatment. A hole injection layer and a hole transport layer are formed on the transparent electrode in this order by a vapor-deposition method. A metal complex and a host material are co-vapor-deposited in vacuum thereon to form a luminescent layer. The metal complex and the host material herein are the same as those described above, and the preferred ranges thereof are also the same. The host material and the metal complex used in the luminescent layer preferably have a molecular weight of 3,000 or less, and the materials used to form the luminescent layer preferably have a molecular weight of 3,000 or less. In cases where the materials have a molecular weight within this range, vapor-deposition of the materials can be facilitated.

As the method for vapor-deposition, any known vapor-deposition method may be used. An electron transport layer and an electron injection layer are formed thereon. A patterned mask is placed on the electron injection layer, and a back electrode (negative electrode) is formed thereon by vapor-deposition. A blocking layer containing an electron transport material may be provided between the electron transport layer and the luminescent layer. Lead wires are connected to the positive electrode and the negative electrode, respectively, so as to produce a luminescent accumulated body. The resultant accumulated body is sealed to fabricate a luminescent device.

The luminescent device is made to emit light by applying a direct current voltage, and the initial luminescent capability can be measured. The driving durability of the luminescent device can be measured and evaluated in terms of a half-value period where the initial brightness is reduced by half.

Applications of the luminescent device of the invention are not particularly limited. The luminescent device of the invention can be suitably used in the fields of display devices, displays, backlights, electrophotography, light sources for illumination, light sources for recording, light sources for exposure, light sources for reading, signs, sign boards, interiors, optical communications, and the like.

EXAMPLES

The luminescent device of the invention will be described in more detail below with reference to the following examples, but the invention is not construed as being limited thereto.

Examples 1 to 6 and Comparative Examples 1 to 5

A 2.5 cm square glass plate having a thickness of 0.5 mm was used as a substrate, which was introduced into a vacuum chamber, and an ITO thin film (thickness: 0.2 μm) was formed thereon as a transparent electrode by DC magnetron sputtering (substrate temperature: 250° C., oxygen pressure: $1 \times 10^{-3}$ Pa) using an ITO target (indium/tin=95/5 by mole) containing $SnO_2$ in an amount of 10% by weight. The ITO thin film had a surface resistance of 10 Ω/sq.

The substrate having the transparent electrode formed thereon was washed with EPA in a cleaning vessel, and then subjected to UV-ozone treatment for 30 minutes.

A hole injection layer was provided by depositing copper phthalocyanine on the transparent electrode by a vacuum deposition method to a thickness of 0.01 μm at a rate of 0.1 nm/sec. A hole transport layer was then provided thereon by depositing N,N'-dinaphthyl-N,N'-diphenylbenzidine (NPD) by a vacuum deposition method to a thickness of 0.03 μm at a rate of 0.1 nm/sec.

An iridium complex as a luminescent material (dopant) and a host material shown in Table 1 below were co-vapor-deposited thereon at rates of 0.015 nm/sec and 0.3 nm/sec, respectively, to form a luminescent layer having a thickness of 0.03 μm.

A blocking layer was provided thereon by using aluminum (III) bis(2-methyl-8-quinolinato)4-phenylphenolate ($Balq_2$) as an electron transport material to a thickness of 0.01 μm at a rate of 0.3 nm/sec.

An electron transport layer was further provided thereon by using tris(8-hydroxyquinolinato)aluminum ($Alq_3$) as an electron transport material to a thickness of 0.04 μm at a rate of 0.2 nm/sec.

An electron injecting layer was further provided thereon by using LiF to a thickness of 0.002 μm at a rate of 0.001 nm/sec.

A patterned mask with a square opening to give a luminescent area of 5 mm×5 mm was placed on the electron injection layer, and a back electrode (negative electrode) was formed thereon by vapor-depositing aluminum to a thickness of 0.25 μm in a deposition apparatus.

Aluminum lead wires were connected to the transparent electrode (which functioned as a positive electrode) and the back electrode, respectively, so as to produce a luminescent accumulated body.

The resultant luminescent accumulated body was placed in a glove box substituted with nitrogen gas. In the glove box, 10 mg of calcium oxide powder as a water adsorbing agent were placed in a stainless-steel sealing cover having a recession inside, and the sealing cover was fixed with an adhesive tape. The luminescent accumulated body was sealed by using the sealing cover and an ultraviolet ray-curable adhesive (XNR5516HV, produced by Nagase Chemtex Corporation) to produce luminescent devices of Examples 1 to 6 and Comparative Examples 1 to 5.

The luminescent devices thus obtained were evaluated in the following manner.

The organic EL device to be evaluated was applied with a direct current voltage by using Source-Measure Unit Model 2400, produced by TOYO Corp. to emit light, and the initial luminescent capability was measured. The maximum brightness was designated as Lmax ($Cd/M^2$), and the voltage providing Lmax was designated as Vmax (V). The luminescent efficiency at 1,000 $Cd/m^2$ was evaluated as an external quantum efficiency ($\eta_{1000}$) (%), and shown in Table 1.

A driving durability test was carried out at an initial brightness of 1,000 $Cd/m^2$, and the time when the initial brightness was reduced by half was designated as a half-value period ($T_{1/2}$) (H).

The results thus obtained are shown in Table 1.

Example 7

A luminescent device of Example 7 was produced in the same manner as in Example 1 except that the hole transport layer was provided by the following wet method.

6 mg of polyvinylcarbazole (PVK) having a weight average molecular weight of 1,100,000 in polystyrene conversion was dissolved in 1 mL of 1,2-dichloroethane to obtain a solution. The solution was coated on the hole injection layer (formed by vacuum deposition of copper phthalocyanine) by a spin coating method at a rotation rate of 1,000 rpm for 1 second to form a hole transport layer having a thickness of 0.05 μm, and further thereon, a luminescent material Ir-1 and a host material were co-vapor-deposited to form a luminescent layer.

The resultant luminescent device was evaluated for green luminescent capability in the same manner as in Example 1. The results thus obtained are shown in Table 1.

Comparative Example 6

A luminescent device of Comparative Example 6 was produced in the same manner as in Example 1 except that the luminescent layer was provided by the following wet method.

2.5 ml of a host material OXD-1, 0.4 g of a luminescent material Ir-1 and 2.5 mg of polyvinylbiphenyl having a weight average molecular weight of 115,000 in polystyrene conversion as a binder polymer were dissolved in 1 mL of xylene to obtain a solution. The solution was coated on the hole transport layer (formed by a vacuum deposition of NPD) by a spin coating method at a rotation number of 1,000 rpm for 1 second to form a luminescent layer having a thickness of 0.02 μm, and further thereon, $Balq_2$ as an electron transport material was vapor-deposited to form a blocking layer.

The resultant luminescent device was evaluated for green luminescent capability in the same manner as in Example 1. The results thus obtained are shown in Table 1.

Comparative Example 7

A luminescent device of Comparative Example 7 was produced in the same manner as in Comparative Example 6 except that the dopant Ir-1 in Comparative Example 6 was replaced by C-4. The resultant luminescent device was evaluated for green luminescent capability in the same manner as in Example 1. The results thus obtained are shown in Table 1.

TABLE 1

| | Dopant | Host material | Hole transport material | Lmax ($Cd/m^2$) | Vmax (V) | $\eta_{1000}$ (%) | $T_{1/2}$ (H) | Luminescent layer forming method | Hole transport layer forming method |
|---|---|---|---|---|---|---|---|---|---|
| Example 1 | Ir-1 | CBP | NPD | 78,000 | 14 | 9.8 | 7,200 | vapor-deposition method | vapor-deposition method |
| Example 2 | Ir-2 | CBP | NPD | 70,000 | 14 | 9.1 | 6,500 | vapor-deposition method | vapor-deposition method |
| Example 3 | Ir-4 | CBP | NPD | 62,000 | 15 | 8.3 | 6,000 | vapor-deposition method | vapor-deposition method |
| Example 4 | Ir-5 | CBP | NPD | 76,000 | 14 | 9.6 | 7,500 | vapor-deposition method | vapor-deposition method |
| Example 5 | Ir-6 | CBP | NPD | 75,000 | 14 | 9.5 | 8,000 | vapor-deposition method | vapor-deposition method |
| Example 6 | Ir-1 | OXD-1 | NPD | 55,000 | 16 | 7.2 | 5,000 | vapor-deposition method | vapor-deposition method |
| Example 7 | Ir-1 | CBP | PVK | 52,000 | 17 | 6.5 | 4,200 | vapor-deposition method | wet method |
| Comparative Example 1 | C-1 | CBP | NPD | 48,000 | 14 | 6.2 | 1,800 | vapor-deposition method | vapor-deposition method |
| Comparative Example 2 | C-2 | CBP | NPD | 46,000 | 14 | 6.3 | 2,000 | vapor-deposition method | vapor-deposition method |
| Comparative Example 3 | C-3 | CBP | NPD | 40,000 | 15 | 6 | 2,500 | vapor-deposition method | vapor-deposition method |
| Comparative Example 4 | C-4 | CBP | NPD | 55,000 | 14 | 7 | 3,000 | vapor-deposition method | vapor-deposition method |
| Comparative Example 5 | C-5 | CBP | NPD | 32,000 | 16 | 4.2 | 550 | vapor-deposition method | vapor-deposition method |
| Comparative Example 6 | Ir-1 | OXD-1 | NPD | 10,000 | 18 | 1.5 | 120 | wet method | vapor-deposition method |
| Comparative Example 7 | C-4 | OXD-1 | NPD | 9,000 | 18 | 1 | 90 | wet method | vapor-deposition method |

The chemical structures of the compounds used are shown below.
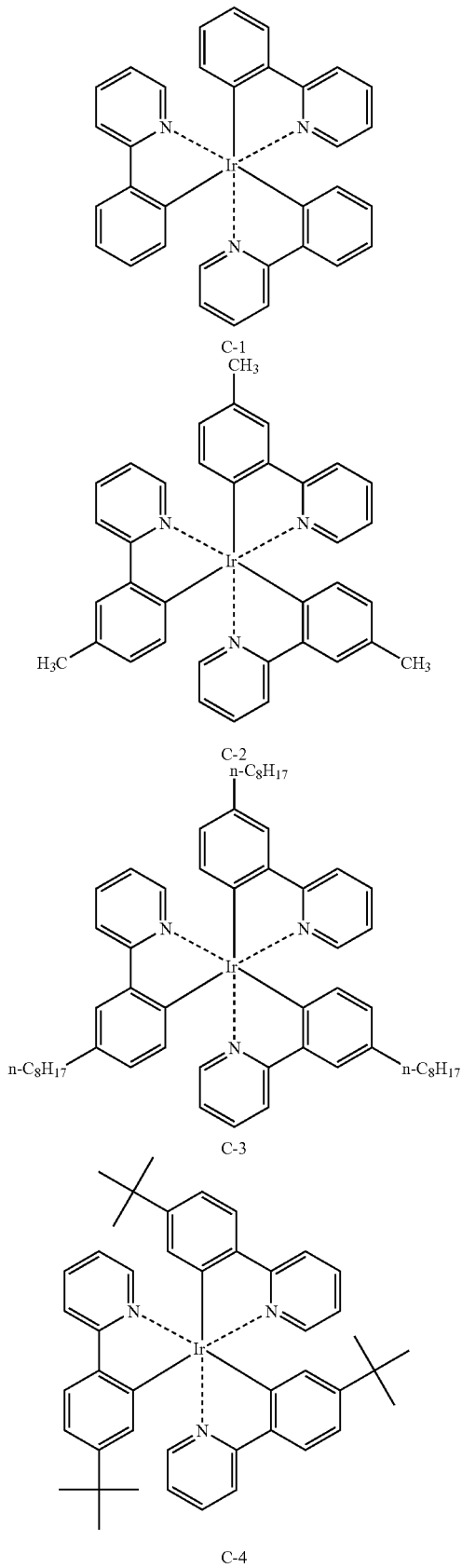
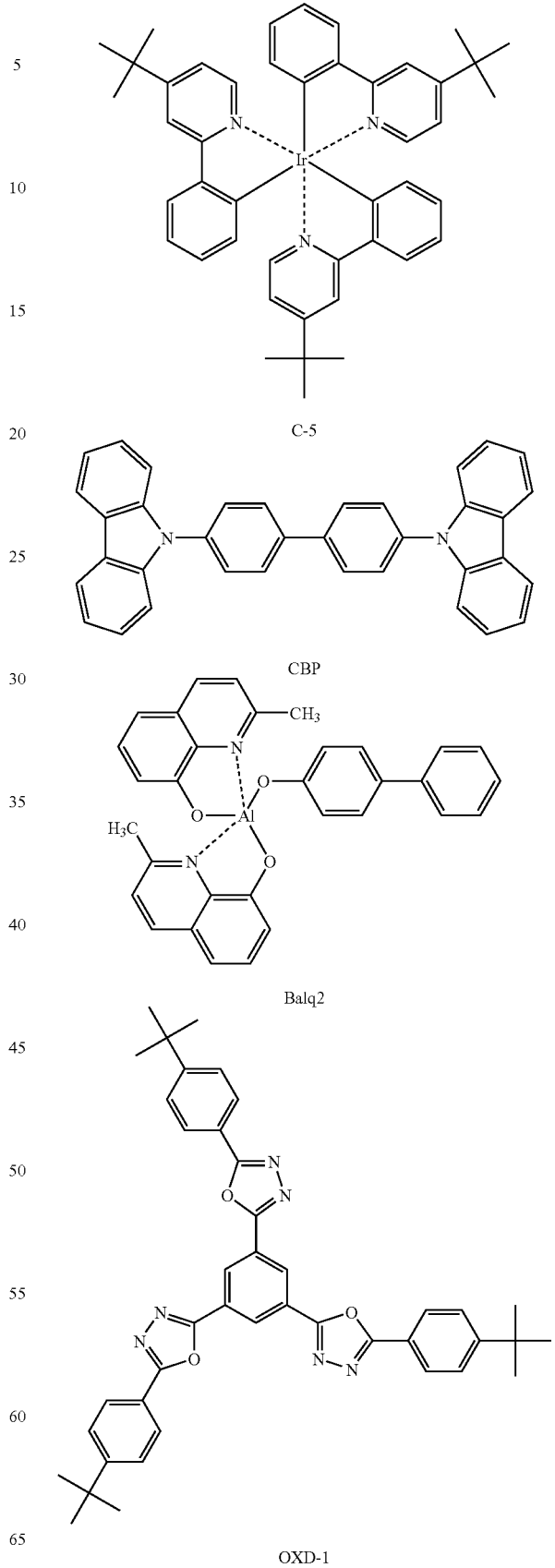

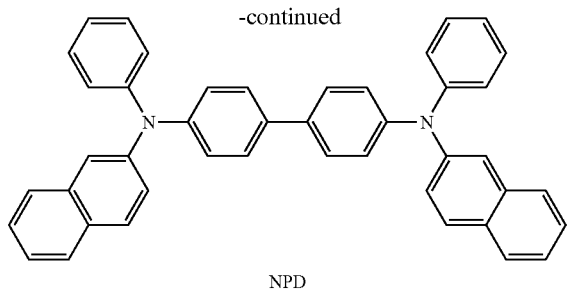

NPD

As is apparent from Table 1, it is understood from the comparison between Examples 1 to 5 and Comparative Examples 1 to 5 that in the case where the metal complex having a substituted vinylpyridine ligand of the invention is used as a dopant, high driving durability can be obtained with high brightness and luminescent efficiency maintained.

It is understood from the comparison between Example 1 and Examples 6 and 7 that in cases where the host material is a material other than a carbazole derivative or in cases where the hole transport layer is formed by a wet method, reduction in brightness, increase in driving voltage, reduction in luminescent efficiency and acceleration of deterioration are slightly observed even though the luminescent layer is formed by a vapor-deposition method using the metal complex of the invention.

The luminescent device of Comparative Example 6 having a luminescent layer formed by a wet method suffers remarkable reduction in brightness, luminescent efficiency and durability even though the metal complex including partial structure (I) of the invention is used, and there is no significant difference in capability from Comparative Example 7 due to the dopant used.

According to the invention, an organic electroluminescent device can be provided that has high brightness and high luminescent efficiency with high driving durability.

What is claimed is:

1. An organic electroluminescent device comprising a luminescent layer produced by a vapor-deposition method disposed between a pair of electrodes, the luminescent layer containing at least one host material and at least one metal complex including a partial structure represented by formula (I):

Formula (I)

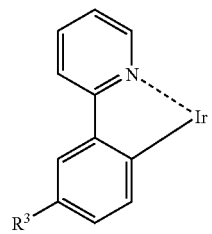

wherein $R^3$ represents a tertiary alkyl group having 5 to 8 carbon atoms;

wherein the metal complex is a complex wherein all three ligands are the same.

2. The organic electroluminescent device of claim 1, wherein the luminescent layer contains only materials having a molecular weight of 3,000 or less.

3. The organic electroluminescent device of claim 1, wherein the luminescent layer contains only materials having a molecular weight of from 200 to 2,000.

4. The organic electroluminescent device of claim 1, wherein the at least one host material comprises a carbazole derivative.

5. A method for producing an organic electroluminescent device comprising a luminescent layer disposed between a pair of electrodes, the method comprising vapor-depositing at least one host material and at least one metal complex including a partial structure represented by formula (I) to form the luminescent layer:

Formula (I)

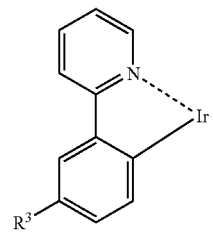

wherein $R^3$ represents a tertiary alkyl group having 5 to 8 carbon atoms;

wherein the metal complex is a complex wherein all three ligands are the same.

6. The method for producing an organic electroluminescent device of claim 5, wherein the at least one host material and the at least one metal complex each have a molecular weight of 3,000 or less.

7. The method for producing an organic electroluminescent device of claim 5, wherein the at least one host material and the at least one metal complex each have a molecular weight of from 200 or more and 2,000 or less.

8. The method for producing an organic electroluminescent device of claim 5, wherein the at least one host material comprises a carbazole derivative.

* * * * *